United States Patent
Nellis et al.

(10) Patent No.: US 7,262,657 B2
(45) Date of Patent: Aug. 28, 2007

(54) BIAS CONTROL FOR REDUCING AMPLIFIER POWER CONSUMPTION AND MAINTAINING LINEARITY

(75) Inventors: Keith Nellis, Sherman Oaks, CA (US);
Andre Metzger, La Jolla, CA (US);
Grant Small, Hiawatha, IA (US);
Michael L. Hageman, Ely, IA (US);
Terry J. Shie, Cedar Rapids, IA (US);
Kerry Burger, Chandler, AZ (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 11/085,931

(22) Filed: Mar. 21, 2005

(65) Prior Publication Data

US 2006/0208796 A1 Sep. 21, 2006

(51) Int. Cl.
*H03G 3/20* (2006.01)
(52) U.S. Cl. .................................. 330/133; 330/136
(58) Field of Classification Search .................. 330/133
See application file for complete search history.

(56) References Cited

U.S. PATENT DOCUMENTS

| | | | |
|---|---|---|---|
| 4,162,452 A | 7/1979 | Ash | |
| 5,553,319 A | 9/1996 | Tanbakuchi | |
| 6,130,579 A * | 10/2000 | Iyer et al. | ................... 330/285 |
| 6,233,440 B1 | 5/2001 | Taylor | |
| 6,300,837 B1 | 10/2001 | Sowlati et al. | |
| 6,445,247 B1 | 9/2002 | Walker | |
| 6,492,875 B2 | 12/2002 | Luo et al. | |
| 6,496,061 B1 | 12/2002 | Bloom et al. | |
| 6,763,228 B2 | 7/2004 | Prentice | |
| 6,771,128 B1 * | 8/2004 | Yamashita et al. | .......... 330/285 |
| 6,819,182 B2 | 11/2004 | Sibrai | |
| 6,873,208 B2 * | 3/2005 | Shinjo et al. | ................ 330/129 |
| 2004/0142674 A1 | 7/2004 | Kuiri | |

FOREIGN PATENT DOCUMENTS

| | | |
|---|---|---|
| EP | 0800267 | 8/1997 |
| GB | 2235855 | 3/1991 |

* cited by examiner

*Primary Examiner*—Robert Pascal
*Assistant Examiner*—Alan Wong
(74) *Attorney, Agent, or Firm*—Weide & Miller, Ltd.

(57) ABSTRACT

A method and apparatus for biasing an amplifying device whereby the bias current tracks the input power or the power level of a control signal to thereby efficiently match the bias current with needs of the amplifying device. This method and apparatus overcomes the drawbacks of the prior art by biasing, not for maximum output power, but for the power level of the input signal or the control signal. In one embodiment a current conditioner operates in connection with the self adjusting biasing circuit to scale or adjust, potentially on an exponential basis, the biasing current for one or more amplifier stages. A cancellation current source may be configured within the bias circuit to cancel unneeded current to further minimize current consumption.

14 Claims, 6 Drawing Sheets

BIAS CONTROL FOR REDUCING AMPLIFIER POWER CONSUMPTION AND MAINTAINING LINEARITY

FIELD OF THE INVENTION

The invention relates to amplifiers and in particular to a bias or gain control for a power amplifier.

RELATED ART

Modern electronic devices often utilize one or more amplifiers to modify the magnitude or power level of an electrical signal. One environment where amplifiers are commonly used is within communication devices. By way of example, wireless communication devices often pass an outgoing signal through one or more amplification stages before transmission. For example, in a wireless communication application, the various stages of amplification selectively vary the power of the signal to a level suitable for transmission and to optionally accommodate communication standards that dictate a transmitted signal's power level. In other environments, amplifiers may be utilized in video display devices, audio devices, audio or video recorders, cameras, or any other device that processes electrical signals.

As is commonly understood, amplifiers are generally biased to have adequate power resources to thereby achieve desired operation. In certain environments, a DC bias circuit is utilized to provide a quiescent current to the amplifier. It is understood that this may be achieved in numerous ways utilizing numerous different circuits. However, many prior art solutions were configured with the primary focus of meeting the challenging linearity requirements at maximum transmit power. Today, however, current consumption is becoming a critical specification due to the reliance on battery power as a primary current source. A device's power consumption directly affects its operational life span per battery charge and, as such, prior art devices that consume an undesirably large amount of current suffer from short operational lifespan per charge. In addition to battery operated devices, current consumption is becoming an issue for wired devices due to an ongoing desire to reduce heat generation and power consumption within an electrical device.

One reason prior art amplifier configurations consumed an undesirably large amount of current was due to the need of the amplifier circuit to meet a particular linearity specification at maximum transmit power. In general, to meet the linearity specification at maximum power output the amplifier stages must be properly biased. However, establishing biasing for amplifiers to meet linearity at maximum transmit power level requires unnecessarily large biasing current when the amplifier is operated at less than maximum transmit power levels. As a result, the prior art amplifiers consume an undesirably large amount of current at less than maximum transmit power levels.

Figure 3:
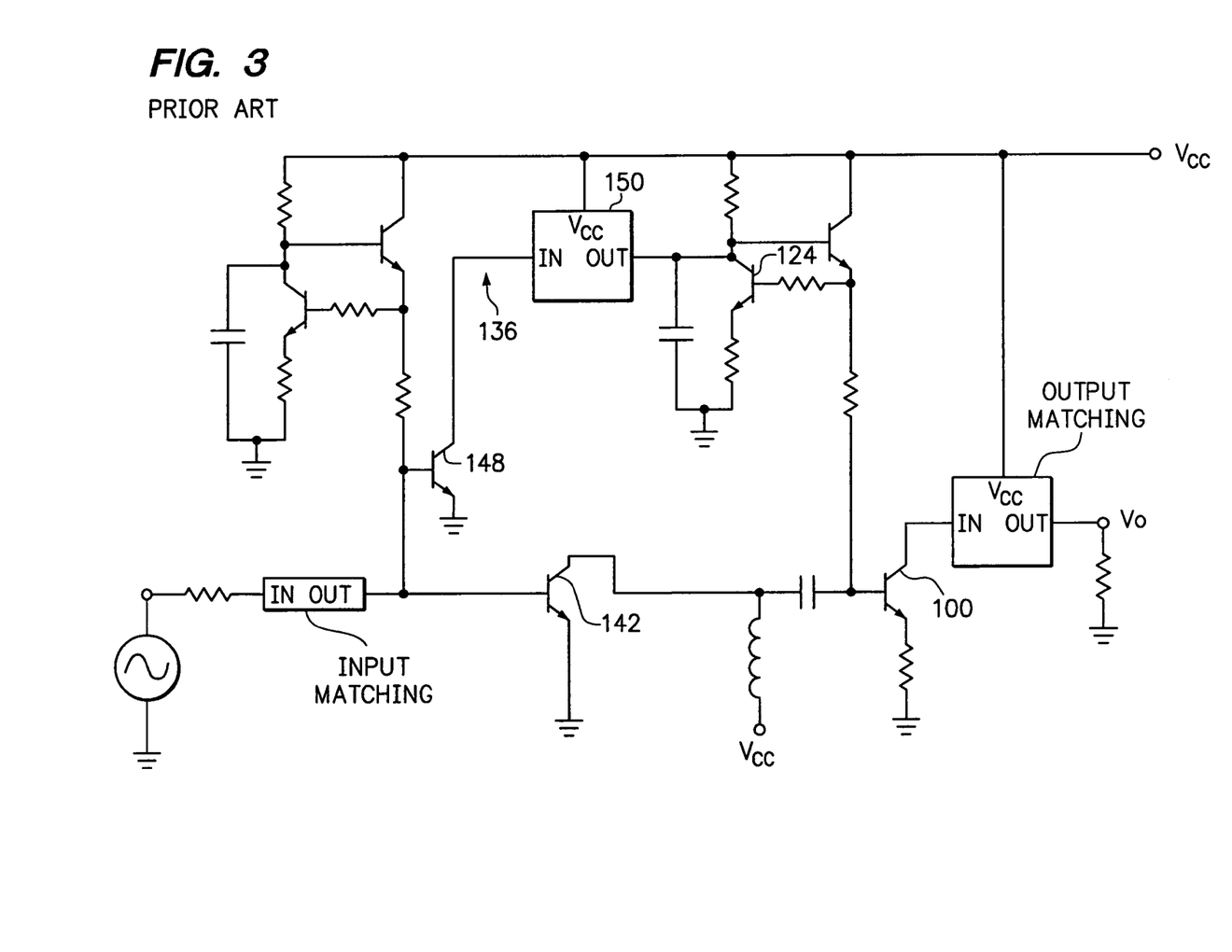
FIG. 3 illustrates a block diagram of a prior art bias boosting circuit.

One proposed solution is outlined in U.S. Pat. No. 6,300,837 issued to Sowlati (hereinafter the '837 reference). The '837 patent discloses a dynamic bias boost circuit for a power amplifier. In particular, the system of the '837 patent, illustrated in one embodiment as shown in FIG. 3, includes a current sensing transistor 148 configured to monitor or sense the input power being delivered to the power amplifier (at the base of device 148) and convert that input power signal into a current signal (at the collector of device 148). As a result, the collector current signal produced by device 148 is proportional to the input current. Therefore, the current that flows through the collector of device 124 is input power dependent due to the combined behavior of device 148 and current mirror 150. Since the quiescent current that flows through the collector of device 100, the power amplifying transistor, is proportional to the current that flows through the collector of device 124, the quiescent current of device 100 is input power dependent. It in turn follows that because the quiescent current is input power dependent, the power amplifier can potentially consume less current at low input power than is typically consumed by other prior art power amplifiers.

Such a solution is not, however, without its drawbacks. One such drawback is that the circuitry shown in FIG. 3 generally requires that device 148 be utilized to sense input power. The drawback with this configuration is that device 148 draws a significant amount of current, which flows directly to ground as shown. As a result, this circuit can actually consume additional power, which to an extent, defeats the purpose of this circuit, which is to reduce power consumption.

In particular, when device 148 senses input power, it converts the input signal into a current and this current is forced into the current mirror 150 through path 136. As such, device 148 draws current in the process thereby reducing battery life.

In addition, in certain embodiments, device 148 could be significantly larger in size as compared to device 124 and the devices of the current mirror 150. Because of its disproportionate size, it consumes an undesirably large amount of space on the integrated circuit and current consumption, which is proportional to size, is a greater concern. In addition, device 148 may require additional circuitry to choke RF from the bias circuit present an appropriate impedance.

Yet another drawback to such a solution, and other similar prior art solutions, is that the RF signal is present on device 148. As such, the RF signal then has the potential to be provided to the current mirror 150 and mirrored into the biasing current of the second stage. As is generally understood, it is undesirable to have an RF signal component on the amplifier biasing signal. As a result, additional components may be necessary to filter or remove this RF component.

Accordingly, there continues to be a need in the art for a power amplifier circuit, which minimizes power consumption, provides linear output if so configured, and meets linearity specification over all output power transmit levels. Moreover, it is desirable to minimize circuit size and complexity.

SUMMARY

Disclosed herein is a method and apparatus for reducing power consumption in an amplifier circuit by forcing one or more bias signals to track the input signal or a control signal that determines output power. In one embodiment, the method for controlling the biasing level of one or more amplifiers comprises providing or receiving an input signal having a power level to a first amplifier stage and a first biasing cell. As is understood, the first amplifier stage may be configured to amplify the input signal. Then, responsive to the power level of the input signal, this method generates a first biasing current within the first bias cell utilizing circuitry within the first bias cell. Because circuitry within or that is part of the first biasing cell monitors the power level of the input signal, additional circuitry is not required. This method also provides the first biasing current to the first amplifier stage such that the magnitude of the first biasing current is proportional to the magnitude of the input signal.

It is further contemplated that this method may further comprise providing the amplified input signal to a second stage amplifier configured to receive and amplify the amplified input signal and mirroring the first bias current to a second biasing cell. The second biasing cell may be configured to generate a second bias current having a magnitude that is proportional to the magnitude of the first bias current, the magnitude of the input signal, or both. Then, the second bias current may be provided to the second stage amplifier such that forcing the magnitude of the second bias current to track the magnitude of the input signal reduces current consumption. In one embodiment, the first stage amplifier comprises a transistor configured to operate in the linear region. In one embodiment, the first bias current and the second bias current may track the power level of the input signal thereby matching bias current levels to the input signal's power level. It is further contemplated that the first stage amplifier may comprise a transistor configured to operate in the saturation region and the input signal may comprise a control signal. In one embodiment, the first bias cell and the second bias cell are configured in a current mirror configuration.

Also disclosed herein is a power amplifier circuit for minimizing current consumption while amplifying an input signal. In one embodiment, this circuit comprises an amplifying transistor configured to amplify an input signal having a variable power level and a DC bias circuit for providing a biasing current to the amplifying transistor at a level necessary to amplify the input signal. In one embodiment, the DC bias circuit is configured in a current mirror configuration such that the current mirror configuration senses the input power and provides the amplifying transistor a bias current in proportion to the power of the input signal.

In one configuration of this circuit, the current mirror configuration mirrors the bias current to one or more additional amplifying transistors and the current mirror configuration is further configured with a current scaling element. For example, the current scaling element may comprise a resistor that performs exponential scaling. In one embodiment, this circuit is also configured with a cancellation current source configured to generate a cancellation current that reduces or eliminates excess bias current. This cancellation current source may comprise a transistor.

In an environment where a control signal is utilized to guide power output, a power amplifier circuit is disclosed that minimizes current consumption while amplifying an input signal based on, for example, a magnitude of a control signal. In one embodiment, this circuit or system comprises an amplifying device configured to amplify an input signal based on the power level of the control signal. Also part of this circuit is a bias circuit for providing a biasing current to the amplifying device at a level necessary to amplify the input signal such that the bias circuit is configured in a current mirror configuration and the current mirror configuration senses the magnitude of the control signal and provides the amplifying device with a bias current in proportion to the magnitude of the control signal.

In one variation of this circuit, the current mirror configuration mirrors the bias current to one or more additional amplifying devices. Furthermore, the current mirror configuration further comprises a current scaling element. In one embodiment, the circuit further comprising a cancellation current source configured to generate and provide a cancellation current to the current mirror configuration that reduces or eliminates excess bias current.

When a control signal is present, then a method for biasing one or more amplifying devices may comprise receiving an input signal and receiving a control signal. The method then detects the control signal with a bias circuit and responsive to the control signal, establishes at least one bias signal. This method also provides the input signal to at least one amplifying device and biasing at least one amplifying device with at least one bias signal such that the magnitude of the bias signal tracks the magnitude of the control signal to thereby establish sufficient biasing of at least one amplifying device to enable amplification of the input signal.

In one embodiment, the bias signal comprises a biasing current and the amplifying device operates in saturation. This method may further comprise duplicating and scaling at least one bias signal to create a second bias signal. Alternatively, or in addition, this method may also further comprise canceling excess bias current with a current cancellation device. In one embodiment, the input signal comprises an RF signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
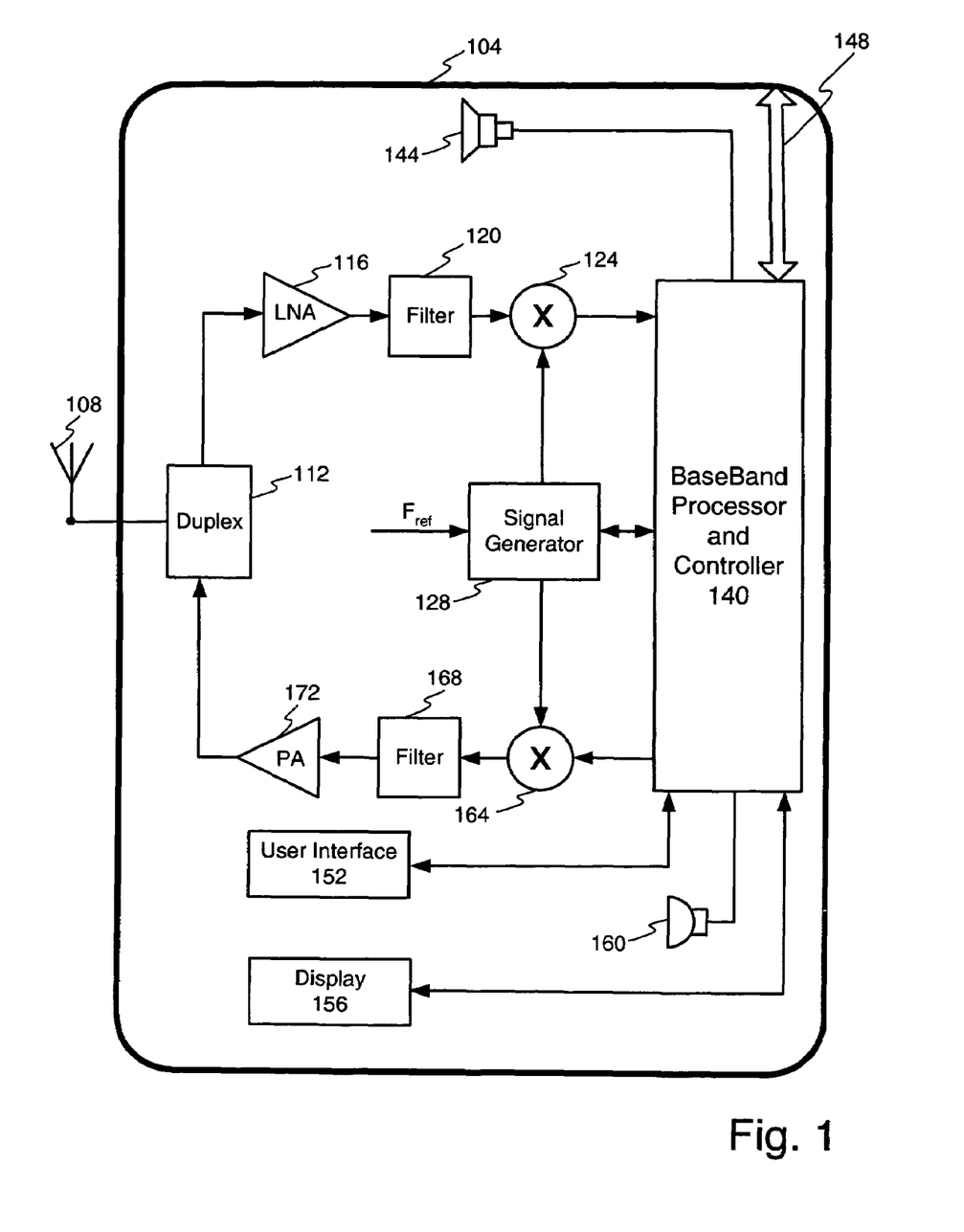
FIG. 1 illustrates a block diagram of an example environment of use in a wireless communication device.

FIG. 1 illustrates a block diagram of a first example environment of use of the invention. The example environment shown in FIG. 1 comprises a wireless communication device but it is noted that this is but one of many possible example environments of use. It is contemplated that the invention may find use in numerous other environments both in the communication field and other fields of use.

The embodiment of a wireless communication device shown in FIG. 1 comprises an outer housing 104 configured to protect and selectively enclose the internal electronic apparatus. An antenna 108 receives incoming signals and transmits outgoing signals. The antenna 108 may be located inside or outside of the housing 104. A duplexer 112 connects to the antenna 108 to route incoming signals to a receiver apparatus, shown as the upper path from the duplexer 112 and route outgoing signals to the antenna.

The duplexer 112 connects to a receiver apparatus (upper path) to hereby route received signals to a low noise amplifier (LNA) 116 that is configured to increase a signal's power level, within a particular frequency band, to a level appropriate for processing by subsequent apparatus. The LNA 116 output connects to a filter 120, which may be configured to perform additional filtering or processing, such as for example band pass filtering or processing to mitigate the effects of the wireless channel.

After filtering, a mixer 124, also known as a down-converter, processes the received signal in conjunction with a signal from a signal generator 128. The mixer 124 may be configured to extract a baseband signal by multiplying the received signal at a carrier frequency with a signal from the signal generator 128 that is also at the carrier frequency. As is well understood, the mixer 124 outputs the desired baseband signal.

The output from the mixer 124 feeds into a baseband processor and controller 140 that is configured to receive and process the incoming baseband signal. In one embodiment, the baseband processor and controller 140 convert the incoming signal to a digital format, processes the digital signal, and then creates an analog signal, which is provided to a speaker 144. Alternatively, the digital signal may be provided directly to a data port 148. In this embodiment, the baseband processor and controller 140 is in communication with the signal generator 128 to synchronize operation.

The baseband processor and controller 140 is also configured to communicate data to and from a user interface 152, such as one or more keys or buttons, and a display 156 configured to display text, graphics, or other information to a user.

To transmit outgoing signals, the baseband processor and controller 140 may receive an outgoing signal from a microphone 160 or digital data from the data port 148. Upon receipt of the outgoing signal, the baseband processor and controller 140 processes the outgoing information into a baseband signal and outputs this baseband signal to a mixer 164, which may also be referred to as an up-converter. The mixer 164 multiplies the baseband signal with an input from the signal generator 128, which is at the desired carrier frequency. The resulting outgoing signal comprises the baseband signal modulated to the carrier frequency and is ready for filtering and processing by the filter 168 and then amplification by a power amplifier 172 to a power level suitable for transmission by the antenna 108 after passing through the duplexer 112.

Figure 2:
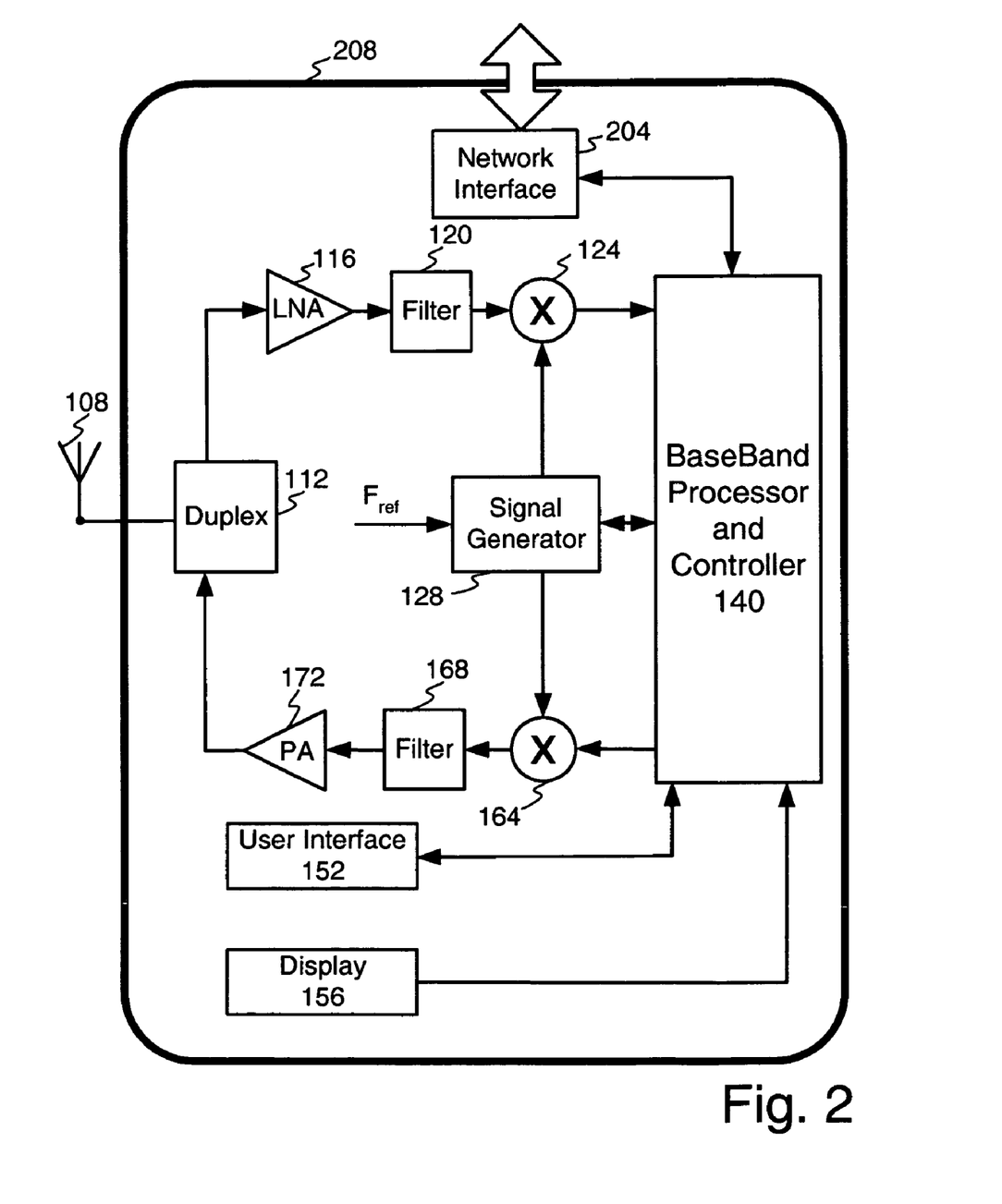
FIG. 2 illustrates a block diagram of an example environment of use in a base station.

FIG. 2 illustrates a block diagram of a second example environment of use of the invention. FIG. 2 shares numerous similarities with FIG. 1 and thus, only the aspects that differ from FIG. 1 are discussed in detail. FIG. 2 is directed to a base station 208 or non-mobile communication device configured to communicate with one or more communication devices. In this configuration, which may represent a base station communication system 208, the baseband processor and controller 140 communicate with a network interface 204. The network interface 204 may be configured to receive one or more signals or packet-based-data from the processor and controller 140. The one or more signals or packet-based-data is output to a computer network, internet, PSTN, or other medium that interfaces with a telephone network, data network, or cellular communication system. When configured as a base station 208, the system shown in FIG. 2 facilitates completion of a mobile telephone call, such as for example, a telephone call from a cell phone, to a land line. These calls are often completed via the network interface 204 of the base station 208.

FIG. 3 illustrates a circuit level diagram of a prior art amplifier bias boosting circuit. FIG. 3, and the associated drawbacks with the embodiment shown therein, are discussed above in the Background section and, as such, FIG. 3 is not discussed again.

Figure 4:
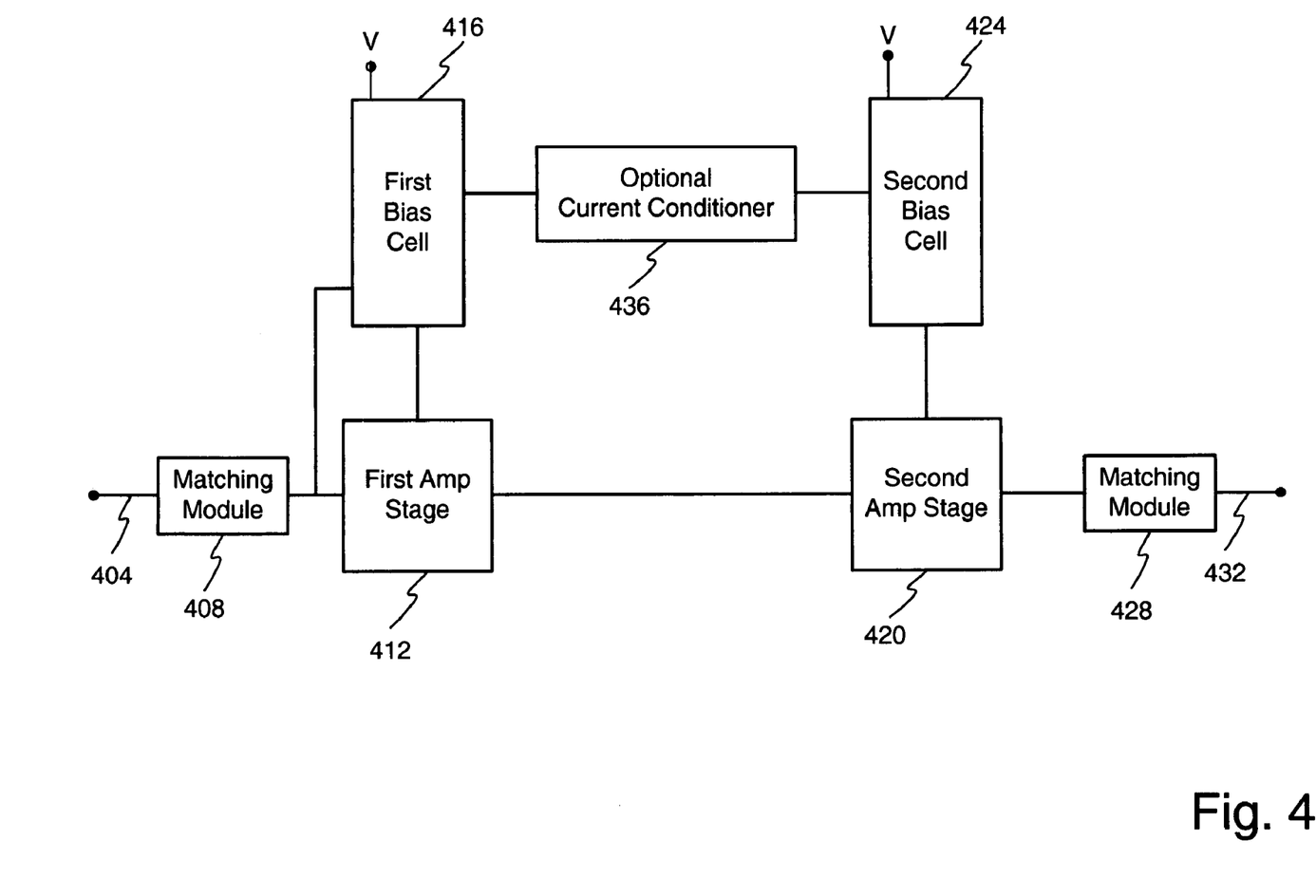
FIG. 4 illustrates a block diagram of an example embodiment of the bias control system disclosed herein.

FIG. 4 illustrates a block diagram of an example embodiment of the bias control design disclosed herein. This is but one possible example embodiment and as such the claims that follow should not be considered as being limited to this particular embodiment. An input 404 connects to a matching module 408, which in turn connects to a first amplifier stage 412. The input 404 may connect to any upstream processing or signal generation device configured to provide an input signal. In this embodiment, the matching module 408 is configured to perform impedance matching between the input and the first amplifier stage to maximize power transfer and minimize unwanted reflections. It is contemplated that depending on the particular design parameters the matching module may not be necessary.

The first amplifier stage 412 comprises one or more amplifiers configured to increase the power level of a received signal. Amplifiers are generally understood and hence, the first amplifier stage 412 is not described in detail. The first amplifier stage 412 is biased by a first bias cell 416. The first bias cell 416 connects to a voltage source V and establishes adequate power resources for the first amplifier stage 412.

The output of the first amplifier stage 412 couples into a second amplifier stage 420. It is contemplated that the second amplifier stage 420 may be configured similarly to the first amplifier stage 412. It is also contemplated that the first amplifier stage 412 may comprise a low noise amplification stage while the second amplifier stage 420 may be configured to achieve high gain levels. The second amplifier stage 420 is biased by a second bias cell 424, which also connects to a voltage source V. In one embodiment, the voltage source V comprises a battery. The output of the second stage amplifier 428 feeds into a matching module 432 configured to impedance match between the second stage amplifier 420 and subsequent apparatus, such as, but not limited to, an antenna.

A current conditioner 436 is interconnected between the first bias cell 416 and the second bias cell 424 as shown. In one embodiment, the current conditioner 436 is configured to modify or scale the current of the biasing cells 416, 424 to achieve desired operation. In one embodiment, the current conditioner 436 scales a signal flowing from the first bias cell 416 to the second bias cell 424. In one embodiment, the scaling is linear while in another embodiment the scaling is non-linear or exponential in nature or accomplished in another manner. Selective use of the current conditioner 436 achieves biasing tailored to the particular requirements for a power output level.

In operation, a signal provided to the input 404 passes through the matching module 408 to the first amplifier stage 412. The signal is also provided to the first bias cell 416. Responsive to the input signal, the first bias stage adjusts its bias level, which sets the bias for the first amplifier stage, to a level tailored to the input signal. For example, for low input power levels, the bias level may be maintained at a low level while for higher input power levels, the bias level of the first amplifier stage 412 may be increased accordingly. The bias level may comprise current, voltage, and may be direct or alternating in nature. In this manner, the bias level for the first amplifier stage tracks the input signal to thereby maintain sufficient biasing to meet the needs of the system while concurrently minimizing power consumption, particularly at lower input power levels.

Similar principles govern operation of the second amplifier stage 420. In one embodiment, the first biasing cell 416 and the second biasing cell 424 are configured in a current mirror configuration and, as such, the biasing of the second bias cell is related to or proportional to the biasing of the first bias cell. As a result, the tracking of the input power level, performed by the first bias cell 416, may be mirrored into the second bias cell 424. This allows the second bias cell 424 to generate a biasing current for the second amplifier stage 420 that is tailored to the requirements of the second amplifier stage based on the power level of the input signal. As a result, the reduction in power consumption is also realized in the second stage, if so equipped.

The current conditioner 436, in on embodiment of operation, tailors or adjusts the ratio between the first bias cell 416 and the second bias level 424 to achieve the proper biasing level of the second stage amplifier 420. For example, the situation may arise wherein the biasing of the first stage amplifier 412 is as desired and adequately tracks the input power of the signal, but the second stage amplifier 420 is only biased correctly at low input power levels. Thus, the current conditioner 436 may be configured to adjust the bias current generated by the second bias cell 424 at high input power levels to maintain desired linearity, for example by using a non-linear modification or scaling ratio. In other embodiments other arrangements may be achieved.

Figure 5:
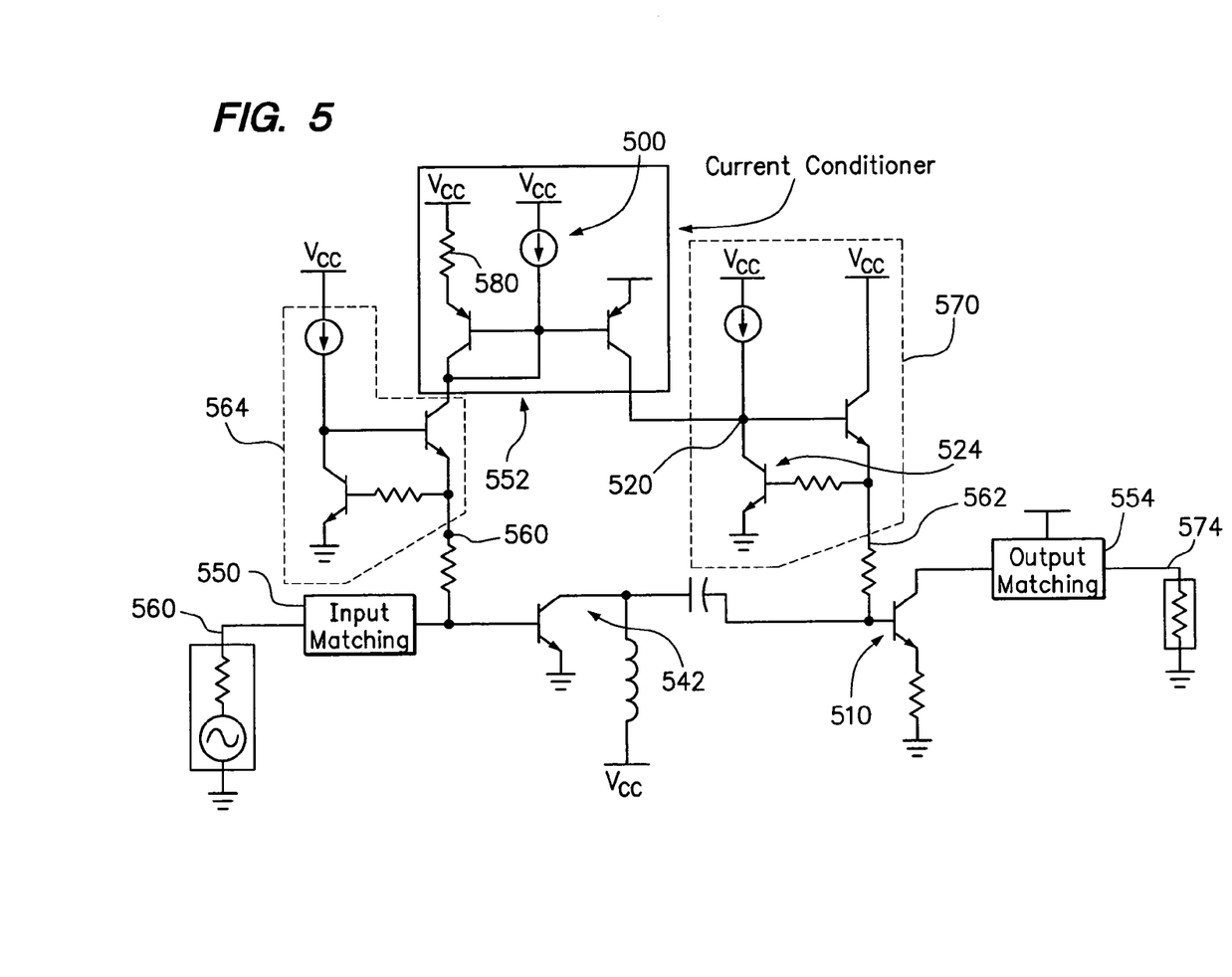
FIG. 5 illustrates a circuit level diagram of an example embodiment of a bias control system.

FIG. 5 illustrates a circuit level diagram of an example embodiment of the bias control design disclosed herein. In this example embodiment, the circuitry attempts to reduce the overall current consumption of a power amplifier, particularly at low input power, through the use of the bias control functionality described below.

As shown, an input 560 receives a signal to be amplified and provides the signal to an input matching module 550. The input matching module 550 may include a DC-blocking element. As described above, the input matching module 550 performs input matching to establish desired impedances between devices. The output of the input matching module 550 feeds into a first stage amplification device 542 configured to amplify the input signal and a first biasing cell 564 comprising, in this embodiment, one or more transistors and a resistor. The first biasing cell 564 connects to a voltage source $V_{cc}$. The first stage amplification device 542 connects to and is biased by a first biasing cell 564, which in this embodiment comprises part of a current mirror.

The output of the first stage amplification device 542 feeds into a second stage amplification device 510. The second stage amplification device 510 also connects to a second biasing cell 570 that is configured to bias the second stage amplification device. The second bias cell 570 comprises one or more transistors and a device 524 and a node 520, both of which are discussed below in more detail. The second bias cell 570 also connects to a voltage source $V_{cc}$ as shown. The output of the second stage amplification device 510 connects to an output matching module 554 configured to perform impedance matching. The opposing side of the output matching module 554 is configured as an output 574.

A current conditioner 552 connects the first bias cell 564 and the second bias cell 570 as shown. The current conditioner 552 may be configured as shown in a current mirror configuration or any other circuit configuration that generally performs as described herein. The current conditioner 552 may optionally further comprise a cancellation current source 500 configured to generate a cancellation current that reduces current consumption by the circuit. In particular, the current from the cancellation current source 500 generates a current that is equal to the quiescent base currents required by transistor 542 and the reference transistor in current mirror within the first bias cell 564. The presence of current source 500 ensures that the currents sensed and mirrored by 552 are independent to the quiescent state of the stage 1 amplifier (transistor 542). Therefore, the currents sensed and mirrored by current conditioner 552 and ultimately fed into current mirror 570 are only the result of changes in RF power levels. Operation of the current conditioner 552 is described below in more detail.

Additional components, some of which are shown and some of which are not shown, complete the configuration of FIG. 5 to enable operation as would be understood by one of ordinary skill in the art. It is assumed that one of ordinary skill in the art is familiar with basic electronic circuit operation and, as such, the following discussion that is now provided focuses on one example embodiment of the invention. In particular, the amplifier device 542 in this embodiment comprises an NPN device that primarily and typically functions as a power amplifier stage. In other embodiments, device 542 may comprise a device other than an NPN device. The amplifier device 542 also senses the input power being delivered to it. This sensing occurs at the base of the amplifier device 542 and as a result the amplifier device 542 converts that input power signal into a current signal, i.e., a base current at the base of device 542. In this embodiment, the base current signal produced by device 542 is proportional to the input power.

Because the base of the amplification device 542 tracks the input power, the output current of the first biasing cell 564 through node 560 also tracks or is proportional to the input power. Thus, as the input power increases, so to does the amount of bias current provided by the first bias cell 564. Conversely, when the power level of the input signal decreases, the bias current from the first biasing cell 564 also decreases. In this manner, the amplifier bias point is held at a minimum or optimum value and overall current consumption is reduced for all input power levels and transmit power levels.

Likewise, the biasing of device 542 is also linked to the biasing of the second stage amplifier 510 through the current conditioner 552 and the second biasing cell 570. The current conditioner 552 in conjunction with the first bias cell 564 and the second bias cell 570 senses an input current, which is the base current produced by device 542, and thereby provides an output current to node 562 that is proportional to the input current. Thus, sensing the input power by device 542 also controls the bias for second stage amplifying device 510. In particular, the current through node 560 is mirrored through the current conditioner 552 to the second biasing cell 570.

Turning now to the second bias cell 570 and the second stage amplifier 510, the current that flows into the collector of device 524 is approximately equal to the total current that flows into node 520. Therefore, the current that flows through the collector of device 524 is input-power dependent due to the combined behavior of device 524 and current conditioner 552. In the embodiment shown in FIG. 5, devices 510 and 524 are NPN type devices although in other embodiments other type devices may be utilized.

Since the quiescent current that flows through the collector of the second stage amplification device 510, in this embodiment a power amplifying transistor, is proportional to the current that flows through the collector of device 524, the quiescent current of device 510 is input-power dependent. The term quiescent current as used herein is generally defined to mean the current consumption of an amplifier when no input signal (or a lower level signal) is presented to the amplifier. The quiescent current may also be referred to as the DC operating point. In one embodiment, instead of fixing the quiescent current at a high level, such as to meet linearity at maximum transmit power, the circuit is configured to force the bias signal of the amplifier to track the input power such that the quiescent current also tracks the input signal and, as such, current consumption is greatly reduced when no signal or a small input signal is provided. In addition, current consumption is reduced, as compared to the prior art, for all transmit power levels.

Because the quiescent current that flows through the collector of device 510 is input-power dependent means that the power amplifier can potentially consume less current (especially at low input power) than is typically consumed by standard power amplifiers. Additional current may be further reduced by use of the current conditioner 550.

As discussed above, the topology of the devices in the current conditioner 552 may be tailored to scale the current generated by the second biasing stage 570. In this manner, the bias of stage 2 only of the circuit of FIG. 5 is dependant on the input power.

An embodiment that implements the optional current conditioner 550 is able to accelerate the rate of change of the output current of current conditioner as a function of input power.

By adjusting the value of R resistor 580, the rate of change, i.e., exponential or a non-linear rate of change, may be adjusted to meet the biasing requirements of the second stage amplifier 510 while also minimizing power consumption at less than maximum transmit power. Therefore, this implementation assures that the minimum amount of current is consumed for each input power level, transmit power level, or both.

Based upon a casual comparison, the method and apparatus set forth herein may be considered to be similar to the system of FIG. 3. Unlike "dynamic bias boost" implementation shown in FIG. 3, the implementation presented herein does not require any explicit input-power sensing circuitry. This provides the advantage of requiring fewer components, which in turn equates to a lower cost, smaller, and less complex implementation. In addition, the reduction in the number of powered components also results in lower power consumption as compared to the system of FIG. 3. In general, the system described herein achieves better performance while at the same time eliminating components as compared to the system of the Figure.

Moreover, the method and apparatus described herein may be configured to utilize a current conditioner 552 to optimize the amount of output current provided to node 520. This capability is missing in the system of FIG. 3. Through use of the current conditioner 552 the power consumption maybe further reduced, the specification for linearity and output power may be met, or both.

Yet another advantage of the system and method described herein over the system of FIG. 3 is that in one embodiment of the method and apparatus described herein, only input-power dependent current is provided to node 520, which reduces current consumption. In the system of FIG. 3 some scaled amount of the quiescent current of stage one is presented in the quiescent current of stage two. This additional stage two quiescent current in the system of FIG. 3 is excessive and unnecessary. Ultimately, this excess current component limits the amount of current that can be saved at low power.

The implementation presented and claimed herein may also be configured with quiescent current offset cancellation current source 500, which in the example embodiment of FIG. 5, is within the current conditioner 552. The quiescent current offset cancellation network, i.e., device 500, eliminates the excess and unnecessary quiescent current that is mirrored from stage one (542) to stage two (510). Eliminating this unnecessary current further reduces the consumed current at various power levels. As shown, scaled copy of current mirror 564 exists within dashed line 570. The collector of the beta-helper transistor in the copy of current mirror 564 is connected to a PNP current mirror much like the one shown in current conditioner 552. However, this extra PNP current mirror does not include resistor 580, nor does it include current source 500. The copy of current mirror 564 acts to measure the quiescent current that should flow through the collector of the beta-helper transistor in current mirror 564. The measured quiescent current is sensed and mirrored by the extra PNP current mirror that was just described. The mirrored output current of the extra PNP current mirror is fed into current conditioner 552 and is represented by the current source 500.

Figure 6:
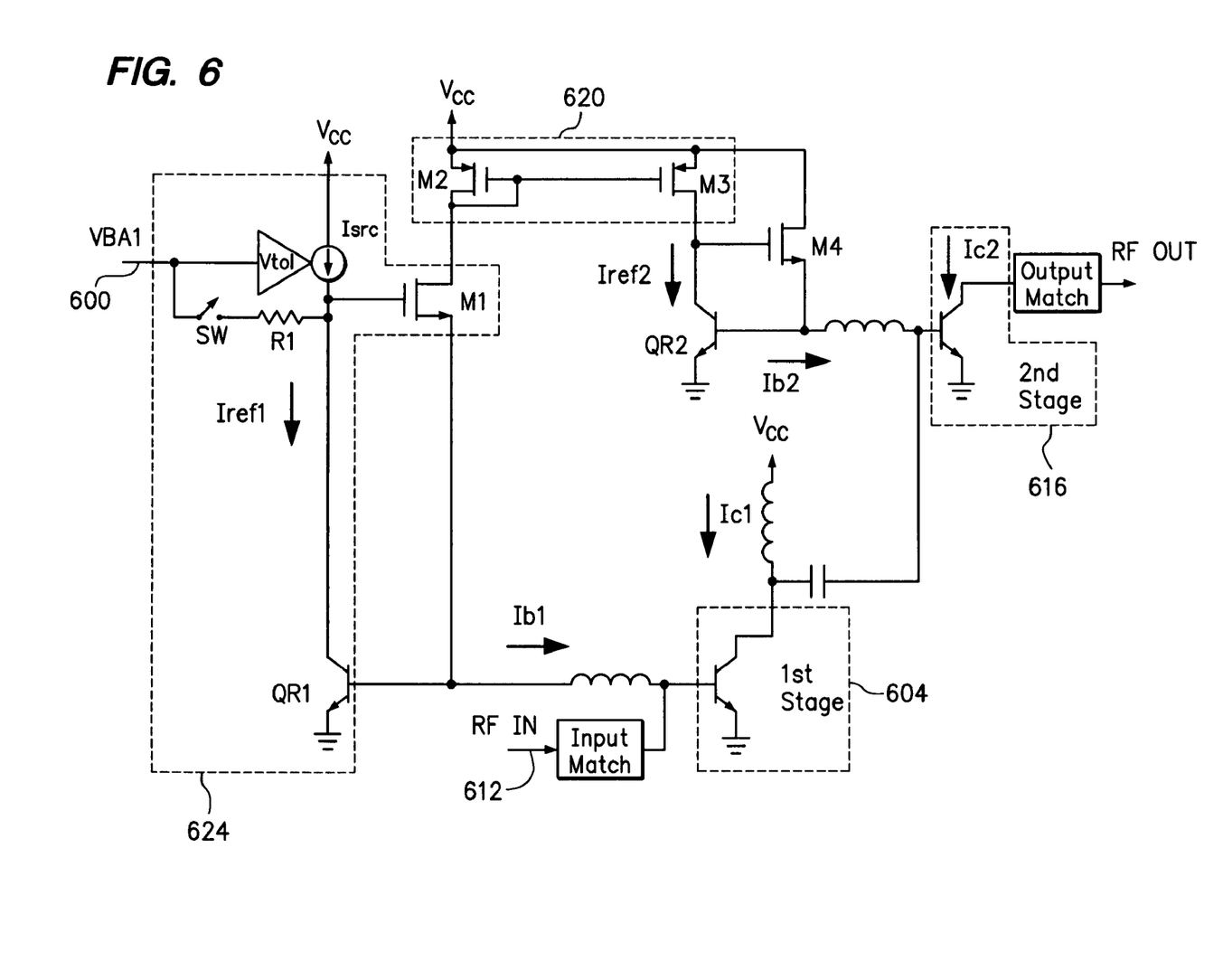
FIG. 6 illustrates an alternative embodiment of the current reduction circuitry configured for use in a fixed input power environment.

FIG. 6 illustrates an alternative embodiment of the current reduction circuitry configured for use in a fixed input power environment. As compared to FIG. 5, similar elements are labeled with identical reference numbers. The example embodiment shown in FIG. 5 is contemplated for use in an environment having an input signal that varies in power. One such exemplary environment where the input signal's power level varies comprises the CDMA communication standard. In contrast, the embodiment shown in FIG. 6 is likewise well suited for use in an environment having an input signal at a fixed power level. This example embodiment may be utilized with the GMSK type communication standard. Of course, these particular communication standards are provided to aid in understanding of the method and apparatus described herein and the claims that follow are not limited to these particular exemplary standards. The following discussion focuses on the aspects and components of FIG. 6 that aid in understanding of the invention. Additional components, which may be shown, but not discussed, would be understood by one of ordinary skill in the art, and hence, are not described in detail.

In the example embodiment shown in FIG. 6, input 600 comprises a power control input configured to receive a control signal representing the desired or intended power level of the output signal. An RF input 612 is part of a first stage amplifier 604. A second stage amplifier 616 connects to the first stage unit 604 as shown. A second stage amplifier 616 connects through a current tracking module 620. In this embodiment, the current tracking module 620 comprises a device M2 and a device M3 configured in a current mirror configuration. The current tracking module 620 is described below in more detail.

A biasing module 624 comprises one or more devices configured to receive the control signal on input 600 and provide an output to the other components, devices or units described above. The biasing module 624 and the current tracking module 620 connect to a voltage source $V_{CC}$. In addition, numerous other components are part of this embodiment, some of which are shown and some of which are not shown, as would be understood by one of ordinary skill in the art.

In operation, the control signal on input 600 is mirrored to create current signal $I_{ref2}$. The signal $I_{ref2}$ may be considered as the analog control signal. As a result, as $I_{ref2}$ is reduced, then $I_{c2}$ is also reduced, which in turn reduces the gain of the $2^{nd}$ stage unit. In this manner, the output power of the power amplifier is controlled based on the control signal on input 600.

To maximize efficiency by reducing current consumption of this embodiment, $I_{ref2}$ can be or is derived from $I_{c1}$ in an attempt to create an optimal biasing relationship. In the example embodiment shown in FIG. 6, $I_{c1}$ can be set equal to $I_{b1}$ times a value beta where beta is defined as the current gain of a circuit or device. The signal $I_{b1}$ is then mirrored to generate $I_{ref2}$ and may optionally be scaled by the current tracking module 620.

In particular, devices M2 and M3 are configured as a current mirror, which mirrors and optionally scales $I_{b1}$. The base current $I_{b1}$ actually goes through device M2. Due to the mirroring of $I_{b1}$, a new and optimal $I_{ref2}$ is created. As a result, biasing of the amplifier stages track, or is controlled by, the control signal received on input 600. Thus, when the control signal is small in magnitude, the biasing is reduced, and when the control signal increases in magnitude the biasing level also increases to meet linearity and/or output power requirements.

It is contemplated that in the example embodiment shown in FIG. 6, the system may operate in the saturation region and not the linear region. As stated above and as compared to the system of FIG. 3, device 148 is eliminated thereby reducing the number of devices needed and the size of the circuit. In addition, current consumption is reduced as compared to the system of FIG. 3 by elimination of device 148, which consumes power, and as compared to other prior art implementations which set the bias current for maximum power output, even during periods when a device is operating at less than maximum power.

Working from these various embodiments, and other embodiments that may be arrived at without departing from the scope of the claims, a method of operation occurs whereby an output power level indicator is created or received. The output power level indicator comprises a signal that represents the desired or intended output power level. For example, the output power level indicator may comprise either an input signal or a control signal, or some other signal or indicator. The bias control system detects or utilizes this output power level indicator to generate one or more bias signals, such as current signals, or voltage signals, or both. In one embodiment, the output power level indicator controls the value of the one or more bias signals. Accordingly, when the output power level indicator increases, either due to an increase in a control signal, input power level, or other factor, the bias signal also increases to accommodate and allow for the generation of a larger output signal. Conversely, if the output power level indicator decreases, the bias signal also decreases. In this manner, current consumption is reduced because the biasing level is tailored to match the input signal or control signal. The input signal or control signal may be detected or, due to circuit topology, mirrored, scaled, modified, or otherwise transformed to draw or generate the desired bias signal.

In one embodiment, an output power level indicator is created or received. The output power level indicator comprises a signal that represents the desired or intended output power level. For example, the output power level indicator may comprise either an input signal or a control signal, or some other signal or indicator. The system detects or utilizes this output power level indicator to generate one or more bias signals, such as current signals. As a result, the output power level indicator controls the value of one or more bias signals. Accordingly, when the output power level indicator increases, either due to an increase in a control signal, input power level, or other factor, the bias signal also increases to accommodate the generation of a larger output signal. Conversely, if the output power level indicator decreases, the bias signal also decreases. The matching of one or more amplifier stage biasing levels to the actual or intended output power level reduces power consumption because for lower input power levels or lower output power levels, the bias level may be reduced thereby reducing current consumption. In this manner, power consumption is reduced because the biasing level is tailored to match the requirements of the desired output signal, which may be controlled based on a control signal or the actual input signal.

It should be further noted that the various embodiments and implementations shown herein may be implemented using various other devices or elements and a such, the claims that follow are not limited to the particular designs or use of the particular elements shown herein. These embodiments are provided for purposes of discussion and explanation. For example, certain elements which are shown as NPN or PNP transistors could be implemented with FETs or NMOS transistors while other elements shown with FETs may be replaced with other elements. Thus, any device may be replaced with any other type device to achieve optimal performance. These design changes are within the skill and understanding of one of ordinary skill in the art.

While various embodiments of the invention have been described, it will be apparent to those of ordinary skill in the art that many more embodiments and implementations are possible that are within the scope of this invention.

What is claimed is:

1. A method for controlling the biasing level of one or more amplifiers comprising:
   providing an input signal having a power level to a first amplifier stage and a first biasing cell, the first amplifier stage configured to amplify the input signal;
   responsive to the power level of the input signal, generating a first biasing current within the first bias cell utilizing the first bias cell;
   providing the first biasing current to the first amplifier stage wherein the magnitude of the first biasing current is proportional to the magnitude of the input signal
   providing the amplified input signal to a second amplifier stage configured to receive and amplify the amplified input signal;
   generating a cancellation current to reduce current consumption;
   mirroring the first bias current to a second biasing cell, the second biasing cell configured to generate a second bias current having a magnitude that is determined by cancellation current and the magnitude of the first bias current, the magnitude of the input signal, or both; and
   providing the second bias current to the second amplifier stage.

2. The method of claim 1, wherein the first amplifier stage comprises a transistor configured to operate in the linear region.

3. The method of claim 1, wherein the first bias current and the second bias current track the power level of the input signal thereby matching bias current levels to the input signal's power level.

4. The method of claim 1, wherein the first amplifier stage comprises a transistor configured to operate in the saturation region and the input signal comprises a control signal.

5. The method of claim 1, wherein the first bias cell and the second bias cell are configured in a current mirror configuration.

6. A power amplifier circuit for minimizing current consumption while amplifying an input signal comprising:
   a first amplifier configured to amplify an input signal having a variable power level to generate a first amplified signal;
   a first bias circuit for providing a first biasing current to the first amplifier at a level necessary to amplify the input signal, wherein the first bias circuit is configured in a current mirror configuration and the current mirror configuration senses the input power and provides the first amplifier a first bias current in proportion to the power of the input signal;
   a second amplifier configured to amplify the first amplified signal to generate a second amplified signal;
   a current conditioner configured to generate cancellation current;
   a second bias circuit for providing a second biasing current to the second amplifier at a level necessary to amplify the first amplified signal, wherein the second bias circuit is configured in a current mirror configuration and the current mirror configuration generates the second bias current in proportion to the power of the input signal, wherein the cancellation current is subtracted from the second bias current to reduce current consumption.

7. The circuit of claim 6, wherein the current mirror configuration further comprises a current scaling element.

8. The circuit of claim 7, wherein the current scaling element comprises a resistor that performs exponential scaling.

9. The circuit of claim 6, wherein the cancellation current source configured to generate a cancellation current that reduces or eliminates excess bias current.

10. The circuit of claim 9, wherein the cancellation current source comprises a transistor.

11. A power amplifier circuit for minimizing current consumption while amplifying an input signal comprising:
    an amplifying transistor configured to amplify an input signal having a variable power level;
    a DC bias circuit for providing a biasing current to the amplifying transistor at a level necessary to amplify the input signal, wherein the DC bias circuit is configured in a current mirror configuration and the current mirror configuration senses the input power and provides the amplifying transistor a bias current in proportion to the power of the input signal, wherein the current mirror configuration mirrors the bias current to one or more additional amplifying transistors and the current mirror further comprises a current scaling element.

12. The circuit of claim 11, wherein the current scaling element comprises a resistor that performs exponential scaling.

13. The circuit of claim 11, further comprising a cancellation current source configured to generate a cancellation current that reduces or eliminates excess bias current.

14. The circuit of claim 13, wherein the cancellation current source comprises a transistor.

* * * * *